United States Patent [19]

Shimizu et al.

[11] Patent Number: 5,413,663
[45] Date of Patent: May 9, 1995

[54] PLASMA PROCESSING APPARATUS

[75] Inventors: Masahiro Shimizu, Kofu; Takayuki Fukasawa, Higashihiroshima; Yuichiro Yamazaki, Tokyo; Motosuke Miyoshi, Tokyo; Haruo Okano, Tokyo, all of Japan; Katsuya Okumura, Poughkeepsie, N.Y.

[73] Assignees: Tokyo Electron Limited, Tokyo; Kabushiki Kaisha Toshiba, Kawasaki, both of Japan

[21] Appl. No.: 74,539

[22] Filed: Jun. 11, 1993

[30] Foreign Application Priority Data

| Jun. 11, 1992 | [JP] | Japan | 4-175913 |
| Jun. 11, 1992 | [JP] | Japan | 4-175914 |
| Jun. 11, 1992 | [JP] | Japan | 4-175915 |
| Jun. 11, 1992 | [JP] | Japan | 4-175916 |

[51] Int. Cl.$^6$ .................................... H01L 21/00
[52] U.S. Cl. .................... 156/345; 118/719; 118/723 FE; 204/298.37; 216/67
[58] Field of Search .......... 118/719, 723 FE, 723 ER, 118/723 E; 156/345, 643; 204/298.37

[56] References Cited

U.S. PATENT DOCUMENTS 4,509,451  4/1985  Collins et al. ............ 118/723 FE X

FOREIGN PATENT DOCUMENTS

| 59-27499 | 2/1984 | Japan . |
| 61-183470 | 8/1986 | Japan | 118/723 FE |
| 63-190299 | 8/1988 | Japan . |
| 64-53422 | 3/1989 | Japan . |
| 1-105539 | 4/1989 | Japan . |
| 1-105540 | 4/1989 | Japan . |
| 1160018 | 6/1989 | Japan . |

Primary Examiner—R. Bruce Breneman
Assistant Examiner—Jonathan D. Baskin
Attorney, Agent, or Firm—Oblon, Spivak, McClelland, Maier, & Neustadt

[57] ABSTRACT

A wafer plasma-etching apparatus includes electron generating, accelerating and processing chambers. Electron are drawn out of plasma generated in the electron generating chamber, accelerated in the accelerating chamber and introduced, as an electron beam, into the process chamber. A semiconductor wafer is positioned flat and parallel to an electron introducing direction in the process chamber. Process gas is introduced into the process chamber and excited into plasma by the electron beam. The wafer is etched by this plasma. Magnetic field is formed at the entrance of the process chamber such that the electron beam is divided to both sides of its extended center line in a horizontal plane and compressed flat in a vertical plane. The magnetic field is also formed such that the electron beam is carried in the horizontal direction at a position where the wafer is arranged in the process chamber. A sheet-like plasma region having a higher density of ions and a more uniform distribution thereof can be thus formed all over the surface of the wafer.

20 Claims, 5 Drawing Sheets

PLASMA PROCESSING APPARATUS

BACKGROUND OF THE INVENTION

1. Field of the Invention

The present invention relates to a plasma-processing apparatus and more particularly, an apparatus for processing a substrate such as the semiconductor wafer with plasma excited by electron beam.

2. Description of the Related Art

In recent years, as semiconductor devices are more finely structured to have a higher capacity, a more finely process must be applied to semiconductor wafers in the course of plasma-etching the wafers. It is needed for this purpose that process gas is more efficiently made into plasma while reducing the pressure in the process chamber of the plasma etching apparatus to a greater extent. As one of the plasma etching apparatuses by which this plasma process can be achieved, there has been well-known the plasma etching apparatus of the electron beam exciting type wherein electrons are drawn out of sub-plasma, accelerated and introduced into the process chamber to excite the process gas into main plasma with which the semiconductor water is etched.

Published Unexamined Japanese Patent Application No. 1-105539 discloses an apparatus of this kind in which electron beam is diffused by a deflecting electrode. Published Unexamined Japanese Patent Application No. 1-15540 discloses an apparatus of this kind in which magnetic field canceling means is provided to diffuse electron beam. Published Unexamined Japanese Patent Application No. 63-190299 discloses an apparatus of this kind in which a pair of electrodes are fixed through a spacer. Published Unexamined Japanese Patent Application No. 64-53422 discloses an apparatus of this kind in which second means is provided to make etching gas into plasma by using other plasma generated by first means. Published unexamined Japanese Patent Application No. 59-27499 discloses an apparatus of this kind in which plasma density is made uniform in such a way that rectangle-shaped permanent magnets are arranged on both sides of electron beam introduced into the process chamber to compress and spread plasma region flat like a sheet by their lines of magnetic force.

In the plasma etching apparatus wherein the semiconductor wafer is positioned perpendicular to the direction in which exciting electrons are shot, the etching process can be achieved by high energy ions. As semiconductor devices are more and more finely structured these days, however, oxide, resist and interconnecting films, for example, formed on the wafer become thinner. In the case of the above-mentioned plasma etching apparatuses, therefore, the semiconductor wafer is contaminated by high energy ions and its insulating and resist films are also broken and inflamed by them. In the case where the wafer is arranged perpendicular to the electron shooting direction, the density of plasma becomes higher as it comes nearer to the center of the wafer. This makes it difficult to apply uniform process to the whole surface of the wafer.

In a case where the processed surface of the substrate is positioned parallel to the electron shooting direction, it is needed that a sheet-like plasma region is formed to have a uniform density relative to the processed surface of the substrate. According to the conventional method of forming the sheet-like plasma region, column-like plasma generated by discharge in magnetic field is compressed and spread flat by a pair of rectangle-shaped permanent magnets. The sheet-like plasma region can be formed to have certain thickness and area according to this conventional method. However, the sheet-like plasma region thus formed leaves beam-like components around its axis. This makes it impossible to obtain a plasma region high and uniform in density all over a larger area. The conventional method of forming the sheet-like plasma region, therefore, is not suitable for uniformly processing such a matter as the semiconductor wafer which has a large area.

The above-mentioned problems are common to the semiconductor wafer plasma processing apparatuses including the plasma etching CVD and sputtering apparatuses which use various kinds of system of generating plasma.

SUMMARY OF THE INVENTION

The object of the present invention is therefore to provide a plasma process apparatus wherein the high density region of plasma excited by electron beam is made more flat like a sheet all over a larger area and the plasma density is made more uniform to achieve a process of higher accuracy.

According to the present invention, there is provided an apparatus for processing a main surface of a wafer-like substrate while using process gas plasma, comprising: an electron generating chamber; means for setting the electron generating chamber at a first vacuum pressure; means for introducing discharge gas into the electron generating chamber; means for making the discharge gas into sub-plasma in the electron generating chamber; a process chamber air-tightly connected to the electron generating chamber; extracting means for drawing electrons out of the sub-plasma; accelerating means for accelerating the electrons thus drawn out and introducing them, as an electron beam, into the process chamber in a first direction; means for setting the process chamber at a second vacuum pressure lower than the first vacuum pressure; means for introducing process gas into the process chamber, the process gas being excited into the process gas plasma in the process chamber by the electron beam; means for supporting the substrate in the process chamber such that the main surface of the substrate is positioned on a first plane substantially parallel to the first direction; means for forming entrance magnetic field in the process chamber and upstream the substrate in the first direction, the entrance magnetic field having, as its main components, lines of magnetic force curved in the first direction such that they are divided to both sides of an extended center line of the electron beam in a plane parallel to the first plane and that they are neared the extended center line of the electron beam in a plane perpendicular to the first plane, and these curved lines of magnetic force which serve as main components of the entrance magnetic field being set to have such a curvature radius that allows the electrons to carry out cyclotron motion while spiraling round each of the lines of magnetic force; magnetic field focusing means arranged in the process chamber and downstream the substrate in the first direction; and means for forming parallel magnetic field, whose main components are lines of magnetic force substantially parallel to the first plane, between the means for forming entrance magnetic field and the magnetic field focusing means.

According to the present invention, electron beam is carried while being divided and compressed flat. A sheet-like plasma region having a higher density and a more uniform distribution can be therefore formed all over the surface of a substrate to be processed. In addition, the sheet-like plasma region thus formed have so larger area as to enable the large substrate to be plasma-processed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Some embodiments of the present invention will be described with reference to the accompanying drawings.

Figure 1:
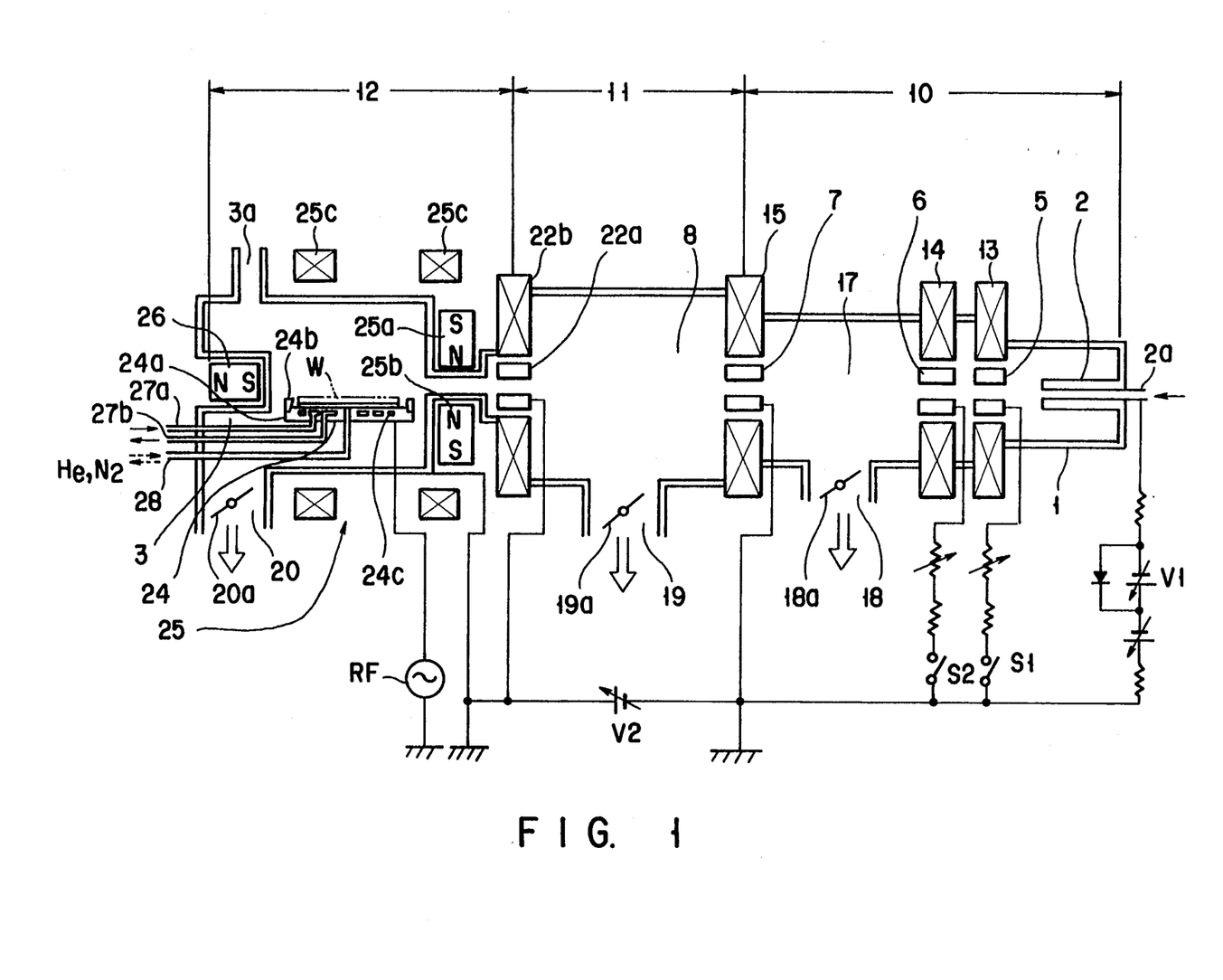
FIG. 1 is a vertically-sectioned view schematically showing the plasma etching apparatus according to a first embodiment of the present invention.

FIG. 1 shows the plasma etching apparatus according to a first embodiment of the present invention. This plasma etching apparatus comprises an electron generating section 10, an electron accelerating section 11 and a plasma processing section 12. The electron generating section 10 makes discharge gases into plasma to generate electrons. The electron accelerating section 11 draws electrons out of the plasma and accelerate the electrons thus drawn out. The plasma processing section 12 shoots the electrons accelerated by the electron accelerating section 11 to process gases including reactive gas to make them into plasma, with which the wafer is processed.

The electron generating section 10 comprises first and second chambers 1 and 17 made of stainless steel, for example, and shaped like a cylinder, and connected to each other through an insulator. A cathode electrode 2 is located at one end of the chamber 1 and it has an inlet 2a extending in the axial direction of the chamber 1. Discharge gases including inactive gas such as Argon are introduced into the first chamber 1 through the inlet 2a.

An anode electrode 7 is located at one end of the second chamber 17 and first and second intermediate electrodes 5 and 6 are arranged between the anode 7 and the cathode electrode 2. A discharge area is formed between the cathode 2 and the anode electrode 7. Ring-shaped electromagnetic coils 13 to 15 are arranged outside the first and second chambers 1 and 17, enclosing the first and second intermediate electrodes 5 and 6 and the anode electrode 7, respectively.

An exhaust opening 18 is formed in the bottom of the second chamber and a vacuum pump (not shown) is connected to this exhaust opening 18 through a valve 18a. The chambers 1 and 17 are kept, during the etching process, under a predetermined vacuum of about 1 Torr and 20 mTorr, respectively, for example, by this vacuum pump.

The electron accelerating section 11 has an accelerating chamber 8 made of stainless steel, shaped like a cylinder and connected to the second chamber 17 of the electron generating section 10 through an insulator. An electron beam accelerating electrode 22a is located at one end of the accelerating chamber 8. This electrode 22a draws electrons out of the plasma in the discharge area, accelerate them and introduce them into a process chamber 3 of the plasma processing section 12. An electron accelerating area is formed between the anode electrode 7 and the accelerating electrode 22a.

A ring-shaped electromagnetic coil 22b encloses the accelerating electrode 22a to generate magnetic field. An exhaust opening 19 is formed in the bottom of the accelerating chamber 8 and a vacuum pump (not shown) is connected to this exhaust opening 19 through a valve 19a. The accelerating chamber 8 is kept, during the etching process, under a predetermined vacuum of $1 \times 10^{-3}$ Tort, for example.

The plasma processing section 12 has the process chamber 3 in which a susceptor 24 is arranged to hold the semiconductor wafer W horizontal. The process chamber 3 is formed of a conductive body having the inner surface coated with an insulating layer, such as an aluminum body having an alumite surface, and connected to the accelerating chamber 8 through an insulator. The inner face of the chamber 3 is covered with an insulator. A pipe 3a is connected to the top of the process chamber 3 and process gases such as chlorine ($Cl_2$) and tetrafluorocarbon ($CF_4$) are introduced into the process chamber 3 through the pipe 3a. An exhaust opening 20 is formed in the bottom of the process chamber 3 and a vacuum pump (not shown) is connected to this exhaust opening 20 through a valve 20a. The process chamber 3 is kept, during the etching process, under a predetermined vacuum of $1 \times 10^{-3} - 1 \times 10^{-4}$ Torr, for example, by the vacuum pump. Therefore, the gradual pressures gradient is set from the chamber 1 to the chamber 3.

Magnetic field is formed in such a manner as will be described later in the process chamber 3. This magnetic configuration determines in fact the orbit of electrons drawn into the process chamber 3 by the accelerating electrode 22a and the electromagnetic coil 22b. Electrons in the process chamber 3 serve to excite process gases to make them into plasma. Therefore, the magnetic configuration virtually determines the shape of the high density region of the plasma in the process chamber 3. The magnetic configuration in the process chamber 3 is an essential part of the present invention and it will be therefore described later. Process gases are excited by the accelerated electrons and made into plasma in the process chamber 3. The high density region of the plasma is shaped like a sheet in this case and this sheet-shaped plasma is used to etch the semiconductor wafer W.

A high frequency power source RF is connected to the susceptor 24 to draw ions of reactive gases and so forth in the excited plasma to the side of the semiconductor wafer W. The frequency of the high frequency power source RF is in a range of several MHz–ten several MHz (or more concretely, 2 or 3 MHz–13.56 MHz). The susceptor 24 includes a body 24a made of aluminum, for example, and a clamp ring 24b attached along the upper peripheral rim of the body 24a to fix and hold the wafer W on the body 24a. A cooling medium flow path 24c is formed in the susceptor body 24a and supply and exhaust pipes 27a and 27b are connected to the flow path 24c. A cooling medium, such as ethylene glycol or ethyl alcohol is supplied into the flow path 24c through the supply pipe 27a and exhausted from the flow path 24c through the exhaust pipe 27b. A closed gas space is formed between the top of the suscepter body 24a and the underside of the wafer W. A supply and exhaust pipe 28 is connected to the gas space to supply and exhaust He or $N_2$ gas into and out of the gas space. This gas He or $N_2$ is used as a medium for increasing heat transmission between the suscepter body 24a and the wafer W.

Magnetic field generating means 25 is located on that side of the plasma processing section 12 which is adjacent to the electron accelerating section 11. Magnetic field focusing means 26 is located at the other end of the plasma processing section 12. A plasma processing area is formed between the magnetic field generating and focusing means 25 and 26.

The magnetic field generating means 25 includes a pair of upper and lower permanent magnets 25a and 25b whose N poles are opposed to each other. Each of the permanent magnets 25a and 25b has a rectangular shape when sectioned. The magnetic field generating means 25 also includes plural (two in FIG. 1) electromagnetic coils 25c which serve to carry the plasma region, which has electrons and which has been made flat, along a flat plane. The magnetic field focusing means 26 is a rod-like permanent magnet, having a rectangular section, and its pole (S pole) reverse to those (N poles) of the permanent magnets 25a and 25b of the magnetic field generating means 25 which are opposed to each other is directed to the plasma processing chamber 3.

It is set in this embodiment that each of the permanent magnets 25a and 25b is 40 mm long and that magnetic field on their surfaces is about 2 KG. It is also set that the magnetic field focusing permanent magnet 26 is 260 mm long and that magnetic field on its surface is about 2 KG. It is also set that each of the electromagnetic coils has about 35 cm inner diameter and current flowing through them is 210 ampere-turn (AT) so that composite magnetic field in the vicinity of the semiconductor wafer W is about 20 G. The magnetic configuration formed by the electromagnetic coil 22b at the electron accelerating section 11, the permanent magnets 25a, 25b, the electromagnetic coils 25c, and the permanent magnet 26 at the plasma processing section 12 has lines of magnetic force shown in FIGS. 2 and 3.

Figure 6:
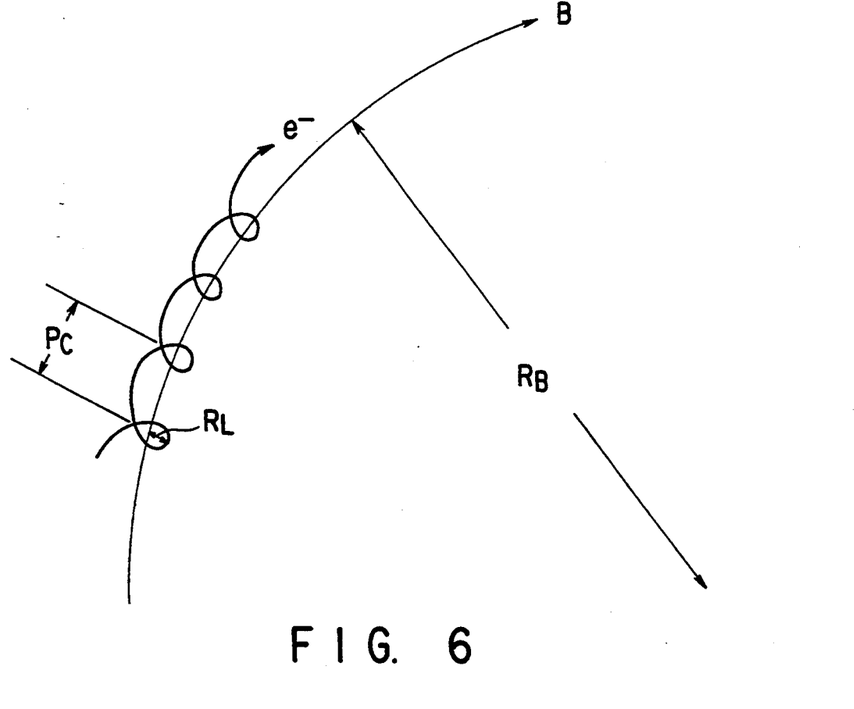
FIG. 6 shows how lines of magnetic force relate to the cyclotron motion of electrons.

The present invention is intended to form a sheet-like plasma region having uniform plasma density all over the processed face (top) of the semiconductor wafer W. The magnetic configuration in the process chamber 3 is therefore set in such a way that electrons introduced as a column-like beam from the electron accelerating section 11 into the process chamber 3 are processed in the following manner. FIG. 6 shows how the magnetic configuration used by the present invention is related to the motion of electrons.

As shown in FIG. 6, an electron e introduced under accelerated state into the process chamber 3 acts a clockwise cyclotron motion while spiraling round a line of magnetic force B under some conditions. Symbols $R_B$, $R_L$ and $P_C$ in FIG. 6 denote the curvature radium of the line of magnetic force, the Larmor radius of electron and the pitch of electron motion, respectively. It is determined by these parameters of $R_B$, $R_L$ and $P_C$ whether or not the electron $e^-$ does the spiraling motion round the line of magnetic force B. The present invention uses this to control the orbit of electrons. In short, the shape of the high density region of the plasma is controlled by changing the shape of the electron beam.

The lines of magnetic force at the entrance of the process chamber B will be described at first. The magnetic configuration at the entrance of the process chamber B is mainly affected by the electromagnetic coil 22b of the electron accelerating section 11 and by the paired permanent magnets 25a and 25b of the plasma processing section 12.

Figure 2:
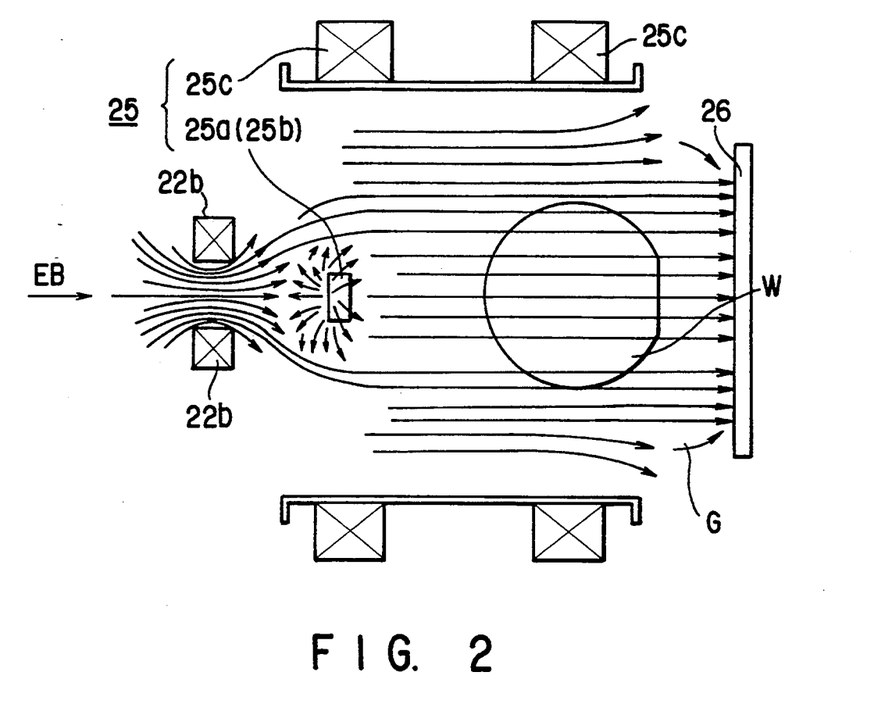
FIG. 2 is a plan view schematically showing a magnetic configuration in a process chamber of the apparatus shown in FIG. 1.

As shown in FIG. 2, horizontal components of the lines of magnetic force generated by the electromagnetic coil 22b and those by the permanent magnets 25a and 25b are directed reverse and canceled one another at the entrance center of the process chamber 3. On both sides of the permanent magnets 25a and 25b, however, they are directed in same direction and composed into strong components.

Figure 3:
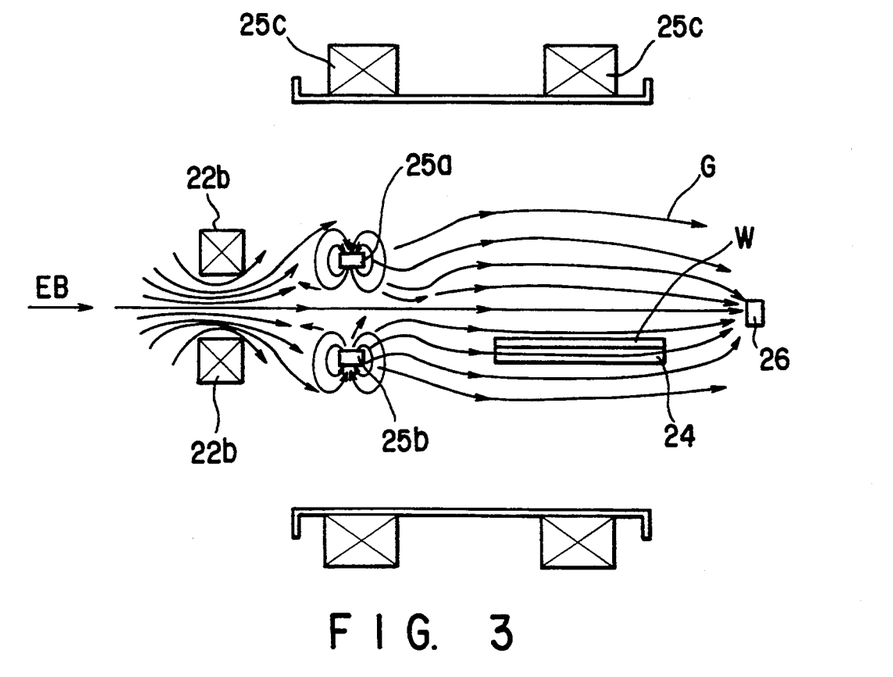
FIG. 3 is a side view schematically showing the magnetic configuration in the process chamber of the apparatus shown in FIG. 1.

As shown in FIG. 3, vertical components of the lines of magnetic force generated by the electromagnetic coil 22b and those by the permanent magnets 25a and 25b are directed reverse at the entrance center of the process chamber 3. However, the components by the electromagnetic coil 22b is stronger than those by the permanent magnets 25a and 25b so that components directed toward the wafer W are left at the entrance center of the process chamber 3. At upper and lower intermediate positions on both sides of the entrance center of the process chamber 3, vertical components of the lines of magnetic force generated by the electromagnetic coil 22b and those by the permanent magnets 25a and 25b are directed reverse and canceled one another.

The typical or characteristic curvature radius $R_{B1}$ of these composed lines of magnetic force extending from the electromagnetic coil 22b along both sides of the permanent magnets 25a and 25b in the horizontal direction is set such that electrons introduced do cyclotron motions, spiraling round the lines of magnetic force. More specifically, the $R_{B1}$ meets either of the following formulas (1) and (2) and more preferably both of them.

$$R_{B1} > 5R_L \quad (1)$$

$$R_{B1} > \tfrac{1}{2} P_C \tag{2}$$

In the case of the vertical direction, the lines of magnetic force generated by the electromagnetic coil 22b and those by the permanent magnets 25a and 25b are directed in same direction and composed at the uppermost and lowermost positions which are over the permanent magnets 25a and 25b.

However, the typical or characteristic curvature radius $R_{B2}$ of these lines of magnetic force composed at the uppermost and lowermost positions becomes so small in value as not to cause the electrons introduced to spiral round the lines of magnetic force. More specifically, the $R_{B2}$ meets either of the following formulas (3) and (4) and more preferably both of them.

$$R_{B2} < 2R_L \tag{3}$$

$$R_{B2} < \tfrac{1}{2} P_C \tag{4}$$

The magnetic configuration is composed as described above at the entrance of the process chamber 3. Most of the electrons introduced as a column-like beam into the process chamber 3, therefore, move along the strong lines of magnetic force rather than passing through the center of the process chamber 3 in the horizontal direction. As the result, the electron beam is divided like a number 8 as shown by a vertically sectioned shape $D_1$ inserted in the plan view of FIG. 4. In the vertical direction, most of the electrons introduced as the column-like beam into the process chamber 3 move, focusing along the lines of magnetic force which pass through the center of the process chamber 3. As the result, the electron beam is compressed flat as shown by D4 in FIG. 5.

As described above, the electrons introduced into the process chamber 3 are not caused to spread up and down, that is, not to follow the lines of magnetic force which have been composed at the uppermost and lowermost positions.

The magnetic configuration in the process chamber 3 or at that position where the semiconductor wafer W is located in the process chamber 3 is mainly affected by the permanent magnets 25a, 25b, the focusing permanent magnet 26 and the electromagnetic coils 25c. The horizontal components of lines of magnetic force extend, as substantially parallel straight lines, from the magnets 25a and 25b to the magnet 26, as shown in FIG. 2. The vertical components of magnetic force lines also extend, as substantially parallel straight lines, from the permanent magnets 25a and 25b to the magnet 26 but they are a little bent in the vicinity of the magnet 26, as shown in FIG. 3, because they are focused by the magnet 26. In order to make the magnetic force line components parallel all over the wafer W, it is preferable that the magnet 26 is made longer than the diameter of the wafer W, extending outside from both ends of the wafer W, as shown in FIG. 2.

The electron beam which has been made flat like the number 8 at the entrance of the process chamber 3 is guided by the parallel magnetic force line components and focused on the magnet 26 while keeping its flat state. During this time, electrons collide against molecules of process gases in the process chamber 3 to excite them into plasma.

Figure 4:
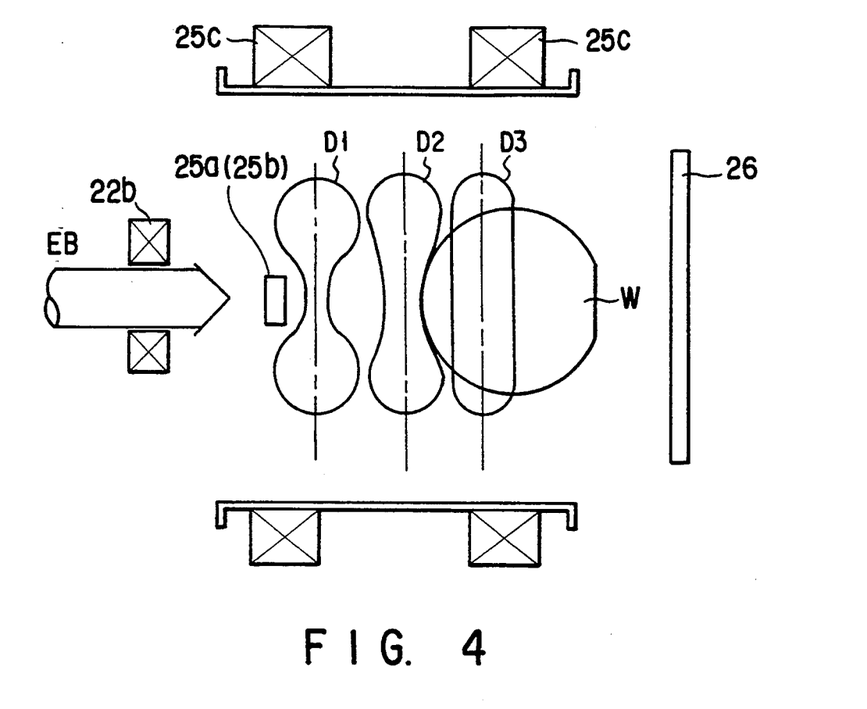
FIG. 4 is a plan view showing how the electron beam is changed in the process chamber of the apparatus shown in FIG. 1, wherein D1, D2 and D3 show vertically sectioned shapes of electron beams.
Figure 5:
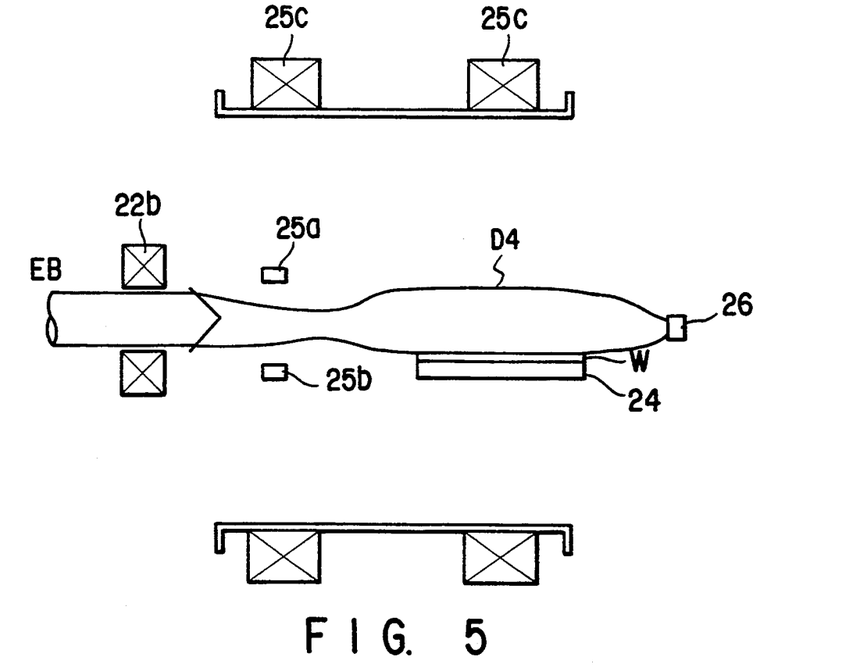
FIG. 5 is a side view schematically showing how the electron beam is changed in the process chamber of the apparatus shown in FIG. 1.
Figure 7:
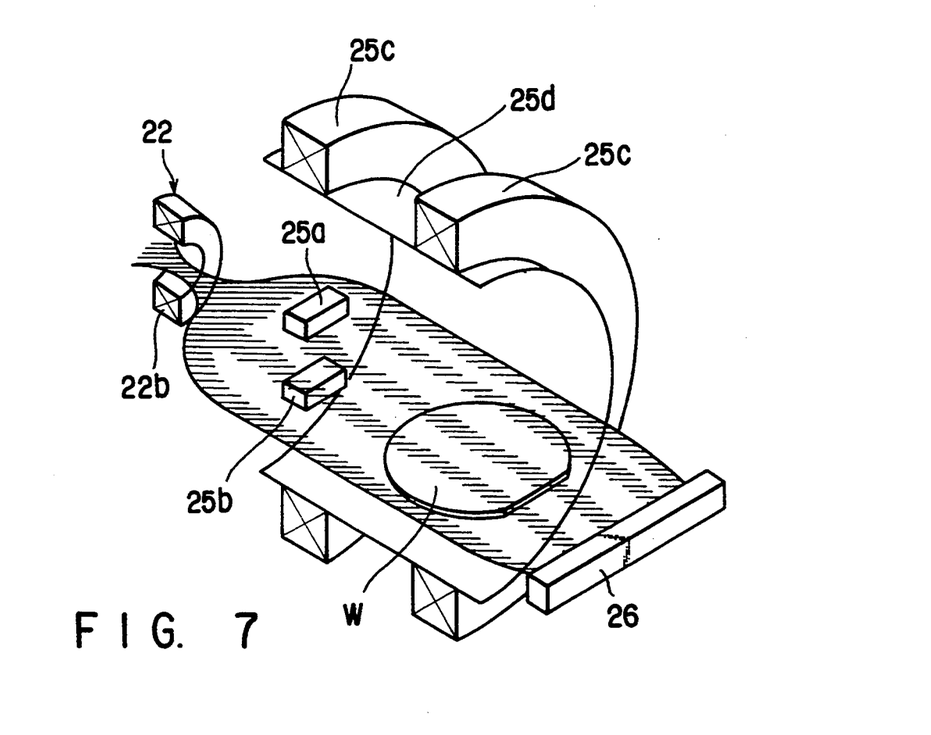
FIG. 7 schematically shows how the electron beam is changed or how plasma is generated in the process chamber of the apparatus shown in FIG. 1.

The distribution of the electrons in the flatted electron beam or the vertically sectioned shape of the beam can be changed from a state represented by the number 8-shape D1 or a more flatted shape D2 to an uniform state represented by a shape D3, as shown in FIG. 4, by adjusting relations in strength of the magnetic field generated by the permanent magnets 25a and 25b, and the electromagnetic coils 22b and 25c. However, the distribution of ions in plasma excited by the electron beam can be uniform even if the sectioned shape of beam is not completely flat. Since ions in plasma on both sides diffuse toward the center thereof, so that a sheet-shaped plasma region having an uniform density can be generated by the electron beam having the sectioned shape D1 or D2. The vertically sectioned shapes D1 to D3 in FIG. 4 denote distribution of electron density as images, but the distribution of electron density is virtually like a continuous band as shown in FIG. 7.

The process gases introduced into the process chamber 3 are excited into plasma by this flat-band-like electron beam. Therefore, they form a sheet-like plasma high density region which corresponds to the shape of the electron beam. The density of the process gases in this plasma region is made uniform on the wafer W, which is thus etched by the plasma.

The operation of the whole plasma etching apparatus will be described.

Pressures in the chambers 1, 17, 8 and 3 are set about 1 Torr, 2 mTorr, $1 \times 10^{-3}$ Torr, and $1 \times 10^{-3}$–$1 \times 10^{-4}$ Torr, respectively, by the vacuum pumps. In short, a pressure gradient is set such that pressures become gradually smaller from the chamber 1 to the chamber 3.

Discharge gas is introduced into the chamber 1 through the gas inlet 2a. Discharge voltage V1 is added, under this state, to the cathode electrode 2 and also to the first and second intermediate electrodes 5, 6 and the anode electrode 7 to generate glow discharge. Plasma is thus generated in the discharge area. The first and second intermediate electrodes 5 and 6 serve to make it easy to cause glow discharge to be created with low voltage. Glow discharge is caused at first between the cathode electrode 2 and the first intermediate electrode 5 and then moves to the second intermediate electrode 6 and the anode electrode 7. After stable glow discharge is created between the cathode electrode 2 and the anode electrode 7, switches S1 and S2 are turned off.

Electrons in the plasma generated as described above are drawn into the accelerating chamber 8 when accelerating voltage V2 is added to the accelerating electrode 22a. They are accelerated and transferred into the process chamber 3 by lines of magnetic force created by the electromagnetic coil 22b. They thus drawn into the process chamber 3 are divided right and left and compressed flat, while being kept as an electron beam, by those magnetic fields which are generated at the entrance of the process chamber 3 as described above in detail. They are moved, while being kept flat, in the process chamber 3 by substantially parallel lines of magnetic force. They excite process gas such as reactive gas $Cl_2$ or $CF_4$ into plasma in the process chamber 3. The sheet-like high density plasma region is thus formed above and adjacent to the semiconductor wafer W mounted on the suscepter 24.

Ions of the reactive gas are drawn out of the sheet-like plasma region by high frequency voltage added to the suscepter 24. These ions are accelerated in a plasma sheath at the surface area of the wafer W and caused to collide, as accelerated ions, against the wafer W and react therewith. The wafer W is thus etched.

Figure 8:
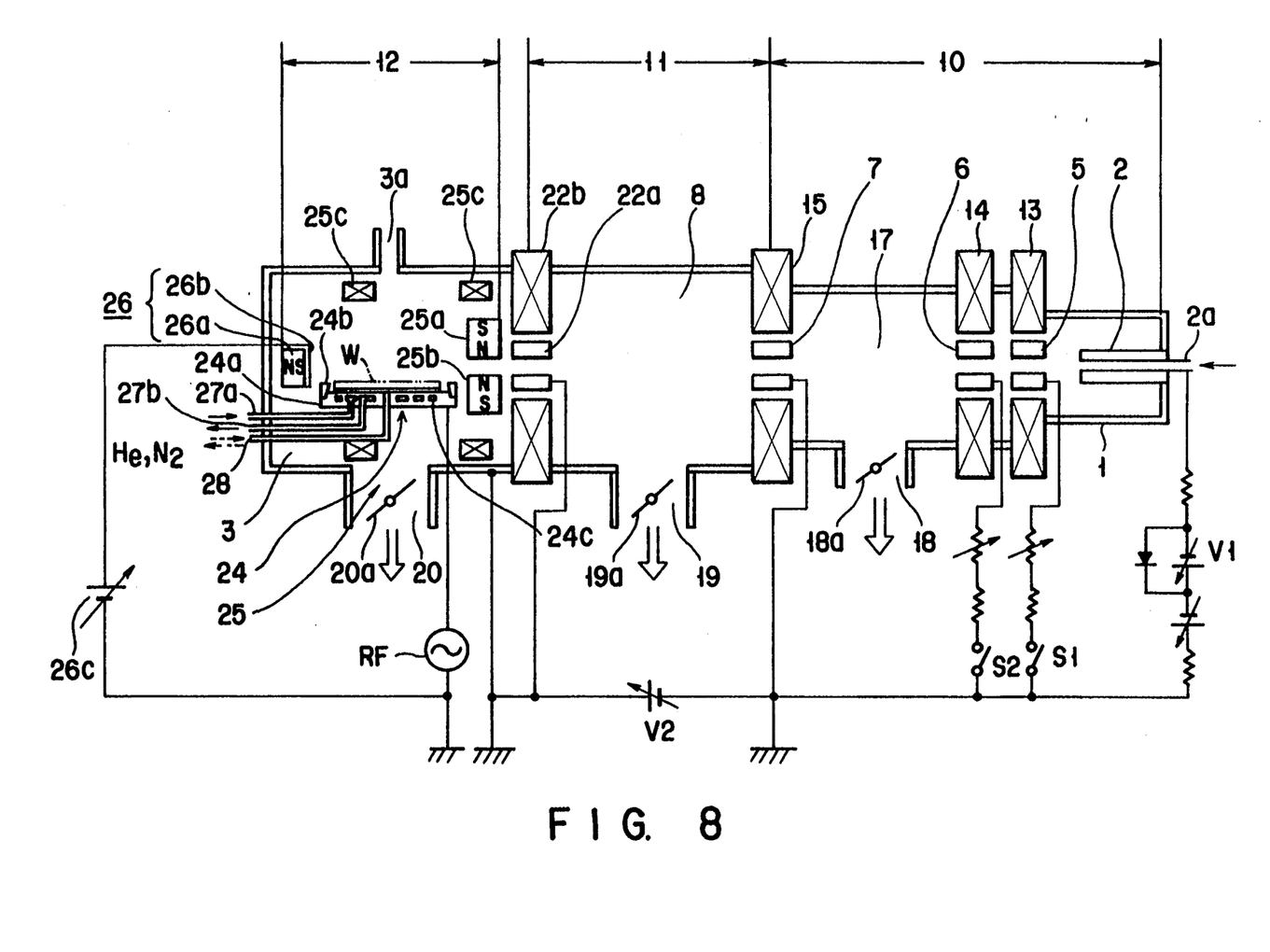
FIG. 8 is a vertically-sectioned view schematically showing the plasma etching apparatus apparatus to a second embodiment of the present invention.

FIG. 8 shows the plasma etching apparatus according to a second embodiment of the present invention. Members corresponding to those of the first embodiment will be denoted by the same reference numerals and description on these members will be omitted.

The second apparatus is different from the first one in the process chamber 3 and in the vicinity of it. In the case of the second apparatus, the permanent magnets 25a, 25b, the electromagnet coils 25c, and the magnetic field focusing means 26 are arranged in the process chamber 3.

The magnetic field focusing means 26 comprises a rod-like permanent magnet 26a having a rectangular shape when sectioned, and an electron take-in electrode 26b located to cover the magnetic field focusing face of the magnet 26a. The permanent magnet 26a is arranged in the process chamber 3 such that its pole (S pole) reverse to those of faces of the permanent magnets 25a and 25b of the magnetic field generating means 25 which are opposed to each other is directed toward the process chamber 3. The electron take-in electrode 26b is made of non-magnetic material, such as stainless steel, and shaped like a plate. Each of the permanent magnets 25a and 25b is 40 mm long and its surface magnetic field is set about 2 KG. The magnetic field focusing permanent magnet 26 is 260 mm long and its surface magnetic field is set about 2 KG. Each of the solenoid coils 25C has an inner diameter of about 3 cm and current of 210 ampere-turn (AT) is supplied to them. The electrode 26b is earthed or connected to a power source 26c which adds a potential about 0V or more to the electrode 26b.

The second apparatus was tested in cases A and B where the electron take-in electrode 26b is kept floating and potential is added to the electron take-in electrode 26b, respectively. Results thus obtained in cases A and B were compared.

Test conditions: Semiconductor wafer W; polycrystal Si Process gas; Ar Coil 22b; 1008 AT Coil 25c; 630 AT Electron take-in electrode 26b in case A; floating Electron take-in electrode 26b in case B; 0V (earthed potential).

The amount of electrons taken in was 3.8 A and the average etching rate was 13.2 Angstrom/min in the case A. In the case B, however, the amount of electrons taken in was 5.3 to 5.5 A and the average etching rate was 32.3 Angstrom/min. When earthed potential was added to the electron take-in electrode 26b, therefore, the amount of electrons taken in was made about 1.4 times and the average etching rate was made about 2.4 times, as compared with the case A where electrons were kept floating.

Since a pass, through which electrons in the electron beam flow or are taken in, is provided by using the electrode 26b and forming a circuit, the number of electrons passing over the wafer W is increased and the density of a plasma region generated by the electrons becomes higher. For this, the electrode 26b is supplied with a potential of about 0V or more, or is earthed so that a simple earth connection can be realized.

The electron take-in electrode 26b of the second apparatus can also be employed by the first apparatus.

It should be understood that the present invention is not limited to the above-described embodiments but that various changes and modifications can be made without departing from the scope and spirit of the present invention. Although a pair of the permanent magnets 25a and 25b are arranged at the entrance of the process chamber 3 in the first and second embodiments, a further or plural pairs of permanent magnets may be arranged downstream the paired permanent magnets 25a and 25b or on the side of magnetic field focusing means 26. When these magnets are added in this manner, a more uniform magnetic configuration can be formed and the uniformity of the sheet-like plasma can be increased.

In addition to the plasma etching apparatus, the present invention can also be applied to other plasma processing apparatuses of the electron beam exciting type such as the CVD and sputtering ones. Further, wafer-like substrates such as LCD can also be processed by the apparatus according to the present invention.

What is claimed is:

1. An apparatus for processing a main surface of a wafer-like substrate while using process gas plasma, comprising:

an electron generating chamber;

means for setting the electron generating chamber at a first vacuum pressure;

means for introducing discharge gas into the electron generating chamber;

means for making the discharge gas into a sub-plasma in the electron generating chamber;

a process chamber air-tightly connected to the electron generating chamber;

extracting means for drawing electrons out of the sub-plasma;

accelerating means for accelerating the electrons thus drawn out and introducing them, as an electron beam, into the process chamber in a first direction;

means for setting the process chamber at a second vacuum pressure lower than the first vacuum pressure;

means for introducing process gas into the process chamber, the process gas being excited into a process gas plasma in the process chamber by the electron beam;

means for supporting the substrate in the process chamber such that the main surface of the substrate is positioned on a first plane substantially parallel to the first direction;

means for forming an entrance magnetic field in the process chamber and upstream from the substrate in the first direction, the entrance magnetic field having, as its main components, lines of magnetic force curved from the first direction such that they diverge toward opposite sides of an extended center line of the electron beam in a plane parallel to the first plane and converge toward the extended center line of the electron beam in a plane perpendicular to the first plane, and these curved lines of magnetic force which serve as main components of the entrance magnetic field being set to have such a radius of curvature that allows the electrons to carry out cyclotron motion while spiraling around each of the lines of magnetic force;

magnetic field focusing means arranged in the process chamber and downstream from the substrate in the first direction; and means for forming a parallel magnetic field, whose main components are lines of magnetic force substantially parallel to the first plane, between the means for forming an entrance magnetic field and the magnetic field focusing means.

2. The apparatus according to claim 1, wherein said radius of curvature is set to meet either formula $R_{B1} > 5R_L$ or $R_{B1} > \frac{1}{2} P_C$ in which $R_{B1}$ represents the radius of curvature, the $R_L$ a Larmor radius of cyclotron motion of the electrons and the $P_C$ a pitch of cyclotron motion of the electrons.

3. The apparatus according to claim 2, wherein said means for forming an entrance magnetic field includes a pair of entrance magnets arranged in the process chamber and upstream from the substrate in the first direction and said entrance magnets are arranged in the process chamber with the electron beam interposed between them in a direction perpendicular to the first plane.

4. The apparatus according to claim 3, wherein said means for forming an entrance magnetic field further includes means for forming introducing magnetic field just before the entrance magnets and along the first direction and arranged upstream from the entrance magnets in the first direction.

5. The apparatus according to claim 4, wherein said means for forming an introducing magnetic field comprises an electromagnetic coil.

6. The apparatus according to claim 3, wherein said pair of entrance magnets comprise permanent magnets such that N poles thereof are opposed to each other.

7. The apparatus according to claim 3, wherein said magnetic field focusing means comprises a permanent magnet whose S pole is opposed to the entrance magnets.

8. The apparatus according to claim 7, wherein the permanent magnet of said magnetic field focusing means is made longer than a width of said substrate, extending outside from opposite ends of said substrate.

9. The apparatus according to claim 3, wherein said means for forming a parallel magnetic field comprises plural electromagnetic coils.

10. The apparatus according to claim 2, further comprising an accelerating chamber for connecting the electron generating chamber and the process chamber with each other and means for setting the accelerating chamber at a third vacuum pressure higher than the second vacuum pressure and lower than the first vacuum pressure.

11. The apparatus according to claim 10, wherein said extracting means comprises an extraction electrode arranged between the electron generating and process chambers.

12. The apparatus according to claim 11, wherein said accelerating means includes an accelerating electrode arranged between the accelerating and process chambers.

13. The apparatus according to claim 2, further comprising an electron take-in electrode arranged adjacent to and upstream from the magnetic field focusing means in the first direction, and means for supplying a potential of about 0 V or more to the electron take-in electrode.

14. An apparatus for processing the main surface of a semiconductor wafer with process gas plasma, comprising:
an electron generating chamber;
means for setting the electron generating chamber at a first vacuum pressure;
means for introducing discharge gas into the electron generating chamber;
means for making the discharge gas into a sub-plasma in the electron generating chamber;
a process chamber air-tightly connected to the electron generating chamber;
extracting means for drawing electrons out of the sub-plasma;
accelerating means for accelerating the electrons thus drawn out and introducing them, as an electron beam, into the process chamber in a first direction;
means for setting the process chamber at a second vacuum pressure lower than the first vacuum pressure;
means for introducing process gas into the process chamber to cause the process gas to be excited into a process gas plasma by the electron beam;
means for supporting the wafer in the process chamber such that the main surface of the wafer is positioned on a first plane substantially parallel to the first direction; and
means for forming a magnetic field in the process chamber, the magnetic field being formed upstream from the wafer in the first direction, such that the electron beam is spread toward opposite sides in a plane parallel to the first plane and compressed in a plane perpendicular to the first plane, and said magnetic field being also formed near a position where the wafer is arranged in the process chamber such that the electron beam is carried substantially parallel to the first plane;
wherein main components of lines of magnetic force of the magnetic field are curved to diverge toward opposite sides of an extended center line of the electron beam from the first direction in a plane parallel to the first plane so as to spread the electron beam, and the radius of curvature of the main components $R_{B1}$ is set to meet either formula $R_{B1} > 5R_L$ or $R_{B1} > \frac{1}{2} P_C$ in which $R_L$ denotes a Larmor radius of cyclotron motion of the electrons and $P_C$ a pitch of cyclotron motion of the electrons.

15. The apparatus according to claim 14, wherein said means for forming a magnetic field comprises:
a pair of entrance magnets arranged in the process chamber and upstream from the wafer in the first direction, such that N poles thereof are opposed to each other with the electron beam interposed between them in a direction perpendicular to the first plane;
means for forming an introducing magnetic field just before the entrance magnets and along the first direction and arranged upstream from the entrance magnets in the first direction;
a magnetic field focusing magnet arranged in the process chamber and downstream from the substrate in the first direction, such that an S pole thereof is opposed to the entrance magnets; and
means for forming a parallel magnetic field, whose main components are lines of magnetic force substantially parallel to the first plane, between the entrance magnets and the magnetic field focusing magnet.

16. The apparatus according to claim 15, further comprising an accelerating chamber for connecting the electron generating chamber and the process chamber with each other and means for setting the accelerating chamber at a third vacuum pressure higher than the second vacuum pressure and lower than the first vacuum pressure.

17. The apparatus according to claim 16, wherein said extracting means comprises an extraction electrode arranged between the electron generating and process chambers.

18. The apparatus according to claim 17, wherein said accelerating means includes an accelerating electrode arranged between the accelerating and process chambers.

19. The apparatus according to claim 18, further comprising an electron take-in electrode arranged adjacent to and upstream from the magnetic field focusing means in the first direction, and means for supplying a potential of about 0 V or more to the electron take-in electrode.

20. The apparatus according to claim 19, wherein said means for introducing process gas comprises means for introducing gas into the process chamber to etch the semiconductor wafer.

* * * * *